(12) United States Patent
Reinhardt

(10) Patent No.: US 10,102,317 B2
(45) Date of Patent: Oct. 16, 2018

(54) COMPUTER MODELING SYSTEM AND METHOD FOR PLENOPTIC SCENE SIMULATION

(71) Applicant: The United States of America as represented by the Secretary of the Navy, Washington, DC (US)

(72) Inventor: Colin Norris Reinhardt, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 15/469,100

(22) Filed: Mar. 24, 2017

(65) Prior Publication Data

US 2017/0278299 A1    Sep. 28, 2017

Related U.S. Application Data

(60) Provisional application No. 62/314,296, filed on Mar. 28, 2016.

(51) Int. Cl.
*H04N 5/225*  (2006.01)
*G06F 17/50* (2006.01)

(52) U.S. Cl.
CPC ......... *G06F 17/5009* (2013.01); *H04N 5/225* (2013.01); *H05K 999/99* (2013.01)

(58) Field of Classification Search
None
See application file for complete search history.

(56) References Cited

U.S. PATENT DOCUMENTS

2012/0179426 A1* 7/2012 Fontes ................ G06F 17/5018
703/1

OTHER PUBLICATIONS

Wolf et al. "Coherence Properties of Optical Fields", Reviews of Modern Physics, vol. 37, No. 2, Apr. 1965.*
Levoy et al. "Light Field Rendering", ACM-0-89791-746, 1996.*

* cited by examiner

*Primary Examiner* — Kee M Tung
*Assistant Examiner* — Yanna Wu
(74) *Attorney, Agent, or Firm* — SPAWAR Systems Center Pacific; Kyle Eppele; Susanna J. Torke

(57) ABSTRACT

A method comprising the step of partitioning a 3D model domain into disjoint subsets of interaction and propagation subdomain volumes, wherein propagator methods transport plenoptic field through extents of volumetric media between interaction subdomain boundaries, wherein distinct interaction methods are applied to each interaction subdomain separately and govern the solution process within the subdomain and field-exchange at boundary.

3 Claims, 2 Drawing Sheets

COMPUTER MODELING SYSTEM AND METHOD FOR PLENOPTIC SCENE SIMULATION

CROSS-REFERENCE TO RELATED APPLICATIONS

This application is a nonprovisional application claiming priority to U.S. Patent Application Ser. No. 62/314,296 filed on Mar. 28, 2016, entitled "Computer Modeling System for Plenoptic Image Simulation," the entire content of which is fully incorporated by reference herein.

FEDERALLY-SPONSORED RESEARCH AND DEVELOPMENT

The Computer Modeling System and Method for Plenoptic Image Simulation is assigned to the United States Government and is available for licensing for commercial purposes. Licensing and technical inquiries may be directed to the Office of Research and Technical Applications, Space and Naval Warfare Systems Center, Pacific, Code 72120, San Diego, Calif., 92152; voice (619) 553-5118; email ssc_pac_T2@navy.mil. Reference Navy Case Number 104016.

BACKGROUND

Described herein is a system and method for software design and architecture for computer modeling, which enables the generation of synthetic imagery with complete plenoptic electromagnetic field information. The system natively models the full plenoptic electromagnetic field as it propagates and interacts dynamically with the environment and macro-scale scene elements such as objects, targets, and material. The system also maintains the accurate physics fidelity required for advanced field analysis. The system addresses a technology gap in current scene modeling and simulation (M&S) tools which are based on underlying models and formulations of light transport, imaging, vision, cameras and sensors which cannot encompass the complete degrees-of-freedom of the plenoptic field.

DETAILED DESCRIPTION OF SOME EMBODIMENTS

Reference in the specification to "one embodiment" or to "an embodiment" means that a particular element, feature, structure, or characteristic described in connection with the embodiments is included in at least one embodiment. The appearances of the phrases "in one embodiment", "in some embodiments", and "in other embodiments" in various places in the specification are not necessarily all referring to the same embodiment or the same set of embodiments.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or.

Additionally, use of the "a" or "an" are employed to describe elements and components of the embodiments herein. This is done merely for convenience and to give a general sense of the invention. This detailed description should be read to include one or at least one and the singular also includes the plural unless it is obviously meant otherwise.

Figure 1:
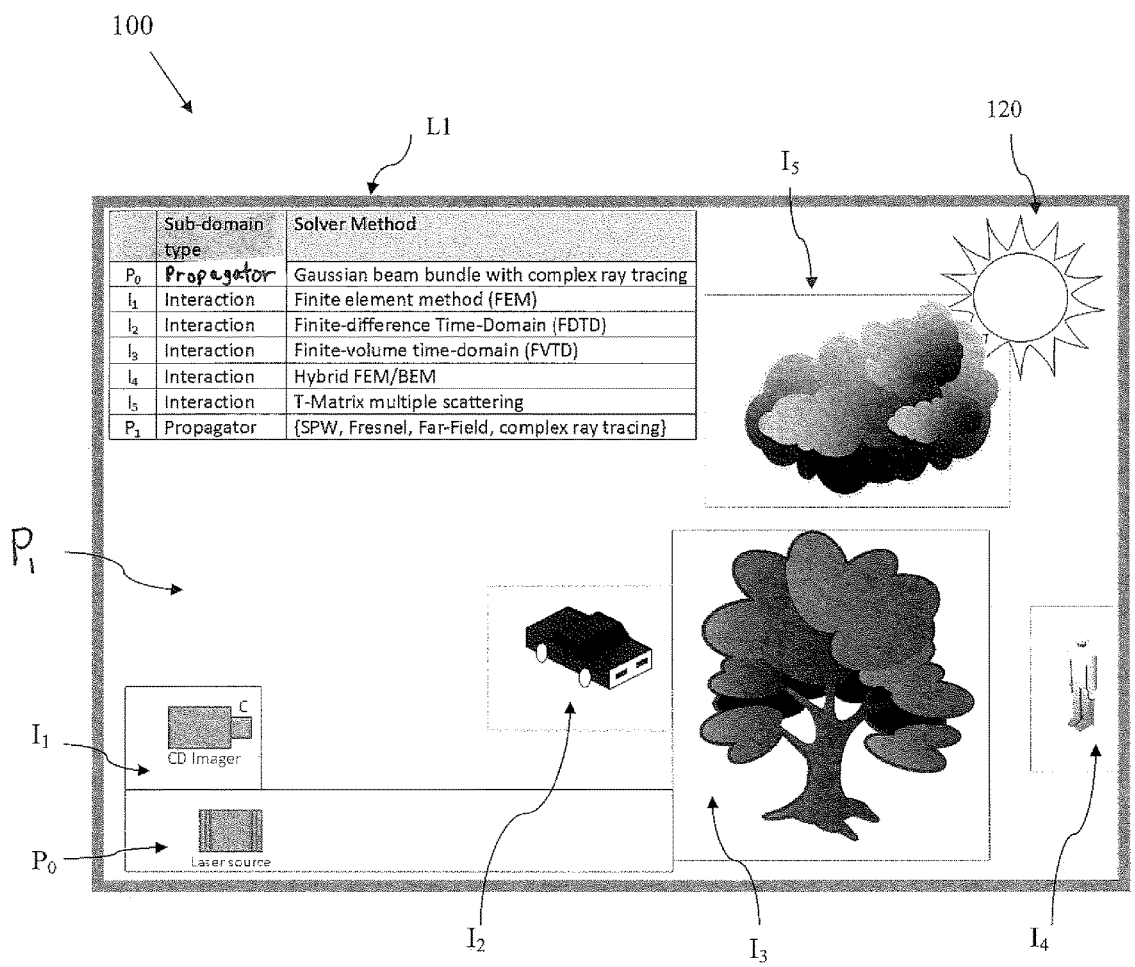
FIG. 1 shows a notional diagram of a simplified plenoptic scene model in accordance with the Computer Modeling System and Method for Plenoptic Scene Simulation.

FIG. 1 shows a simplified plenoptic scene system (System) 100 having sub-domain scene objects $I_0$-$I_5$ and $P_0$ and $P_1$, partitioned into disjoint subsets of interaction and propagation subdomain volumes. FIG. 1 also shows a legend L1 which describes each scene object's sub-domain types and an example of an associated solver method for each sub-domain. Alternate embodiments of System 100 could have sub-domain scene elements including material and targets in lieu of or in addition to those shown in FIG. 1. Depending on the types of material, object, and/or target elements which are present within the boundaries of a given sub-domain, a particular solver method may offer the best accuracy, best performance, or a balance of accuracy and performance. System 100 allows the definition and addition of new solver methods.

System 100 has a laser source $P_0$ which has a propagator sub-domain type and a Gaussian beam bundle with complex ray tracing solver method. System 100 has a CCD Imager $I_1$ with an Interaction sub-domain type and a Finite element method (FEM) solver method. System 100 has an object $I_2$ with an interaction sub-domain and a finite-difference time-domain (FDTD) solver method. System 100 has an object $I_3$ with an interaction sub-domain type and an L-systems with discrete dipole approx. (DDA) solver method. System 100 has an object $I_4$ with an interaction sub-domain type and a fast multipole method (FMM) solver method. System 100 has an object $I_5$ with a T-matrix multiple scattering solver method. System 100 has an object $P_1$ with a propagator sub-domain type and several examples of possible propagator solver methods such as the spectrum of plane-waves (SPW) method, the Fresnel diffraction integral method, the far-field approximation method, or the complex ray-tracing solver method. System 100 also has a solar radiance source 120.

Throughout System 100, the fundamental native unit of data information representation will be the full plenoptic field, which is defined as a general multi-dimensional continuous field containing the space- and time-dependent electric and magnetic fields, from which it is possible to directly obtain quantities including: {x, y, z, t}—components of time-varying vector electric and magnetic fields, 3×3 second-order coherence tensors, cross-spectral density tensors, 2×2 coherence/polarization matrix, Stokes parameters, Jones vectors, Poynting vector, and related energy flux quantities. System 100 models and simulates the interaction and propagation of plenoptic field throughout the model volume and with all contained scene objects by using a combination of propagator and interaction methods. The plenoptic electromagnetic field information degrees-of-freedom include: electric and magnetic field three-dimensional spatial components, two-dimensional angular, frequency, time, polarization, and phase/coherence.

Propagation solvers are used in propagator domains, and provide methods for propagating the plenoptic field through regions of free space and volumetric participating media where there are no intersections/interactions with scene element models. Propagation solvers may provide either efficient (low computational cost and/or low compute time demands) or high accuracy methods. The system will include built-in propagation solvers of the following types:
1. the angular spectrum of plane wave (SPW) method,
2. variants of the Fresnel approximation and the far-field representation,
3. the spherical wave expansion,
4. Gaussian-beam bundles with complex ray tracing,
5. the beam propagation (PE) method, and
6. phase-space optical propagator using the Wigner distribution Additionally, new custom propagation solvers may be implemented and added to the system using the extensible custom propagation solver interface specification.

Interaction solvers are used in interaction domains, and provide methods for solving the plenoptic field distribution throughout regions which include intersections/interactions with scene element models. Interaction solvers may be designed to provide either efficient (low computational cost and/or low compute time demands) or high accuracy methods. The system will include built-in interaction solvers of the following types:
1. Finite-difference time-domain (FDTD)
2. Finite element method (FEM)
3. Finite volume method (FVM) and finite-volume time-domain (FVTD)
4. Method-of-moments (MoM)
5. Boundary-element method (BEM)
6. T-Matrix multiple-scattering method
7. Thin-element approximation (TEA)

New custom interaction solvers using computational electromagnetics (CEM) methods or other methods may be developed and added to the system using the extensible custom interaction propagation solver interface specification.

In addition to the core system components of interaction and propagator domains and their associated solver methods, the system will also provide a full library of plenoptic-aware components. This is essential since standard computer modeling elements do not provide the ability to interact with the full plenoptic field representation. The library of plenoptic-aware components will include: radiance sources, materials, scene objects and targets, optical components, detectors, receivers (a composite part type as described below), and volumetric atmospheric random media. Each of these components is described in more detail below.

Plenoptic-aware radiance sources provide the capability to generate and emit energy into the modeled domain in the form of plenoptic fields. A solar radiance source with a spatial coherence model will be provided. In addition, a general plenoptic field source with configurable spectra, temporal and spatial coherence profiles, polarization, and temporal (pulse) characteristics and spatial beam profiles will be provided in the system library. This general source can be duplicated and customized to represent any existing electromagnetic field source (antennae, LIDAR, laser, LED, thermal, etc.) and also to create novel new source types in the future. Multiple instances of the general source type can be combined to create multi-spectral source types.

The plenoptic-aware materials library will include plenoptic bi-directional transmittance/reflectance/scattering/absorptance distribution functions (BxDFs). These plenoptic material BxDFs can be based on either analytical models or measured data values. Custom-defined BxDFs may be created and added to the system to support arbitrarily complex user-defined novel and experimental materials through the BxDF extension interface.

The plenoptic-aware library of scene objects and targets with provide a basic set of standard objects and target parts for defining plenoptic scenes. The objects and targets will have plenoptic-aware material definitions and properties. Objects and targets will include such items as: basic environmental elements: grass, soil, shrubs, trees, brick, concrete, rock, water; scene target elements: basic geometrical shapes (sphere, cube, plate, etc.), and various types of cars, planes, boats, clothed humans.

The plenoptic-aware library of optical components will include a set of standard lens types such as concave, convex, plano-convex, meniscus, Diffraction gratings, spatial light modulators, deformable mirrors. The system will also allow aperture-plane fields to be exported for use in optical design tools such as ZeMax, ASAP, CODE-V, FRED or other custom post-processing, and also imported into the plenoptic system to provide high-resolution/precision outgoing/emitted source field models from those optical design/modeling tools.

The plenoptic-aware library of detectors will include customizable and user-configurable models of both photon (quantum) and thermal detector types, including infrared (IR), thermal (bolometric and pyroelectric), and composite optical detector types such as CCD and CMOS focal-plane arrays (FPAs) composed of materials such as silicon (Si), indium-gallium-arsenide (InGaAs), mercury-cadmium-telluride (HgCdTe) or MCT-type, and bucket avalanche photodiode (APD) detectors, and various photoconductive, photovoltaic, and photoemissive detectors. The detector models will support all the standard specifications and parameters appropriate for the devices. The system will also support the definition of new novel detector types with user-defined mechanisms and physical models using the detector extension interface.

The plenoptic-aware library of receivers will include a default set of generic receiver types, composed of combinations of parts from the optical components and detector libraries. The default receivers will include visible-band, near-infrared (NIR), short-wave infrared (SWIR), mid-wave infrared (MWIR), and long-wave infrared (LWIR) waveband receivers. The default receiver part types can be customized and each parameter tailored by the user to represent specific receiver configurations or as a starting point to test new configurations.

The plenoptic-aware library will also include models for participating media, specifically of volumetric atmospheric random media. This media can be used within propagator sub-domains to provide physically accurate advanced atmospheric propagation effects, such as refractivity gradients, refractive-index turbulence profiles, and poly-disperse multi-species distributions of aerosol and particulates with multiple-scattering, which are not limited to spherical shapes. The atmospheric model can represent inhomogeneous and time-varying discrete random media in quasi-continuous background medium. It will include realistic plenoptic profiles of atmospheric turbulence, aerosol distributions, and refractivity, with accurate spectral complex refractive-index models, humidity, water-vapor. The library of participating media model components will also include a set of plenoptic-aware phase-functions to represent media scattering behavior while preserving the full plenoptic field data.

The plenoptic computer system also allows the full plenoptic field results to be saved to an open-source file format which ensures lossless-compression and preservation of full numerical precision of all results. The file storage interface is flexible and extensible to allow new formats and export/import interfaces for other data formats.

In order to achieve acceptable system response times for the modeling and rendering of such high-complexity and computationally demanding scenes with full plenoptic field resolution throughout, the system will be designed to utilize a highly-parallelized rendering and compute system architecture, employing the latest hardware and software technologies for heterogeneous CPU-cluster+GPU platforms with high-speed memory interconnects.

Figure 2:
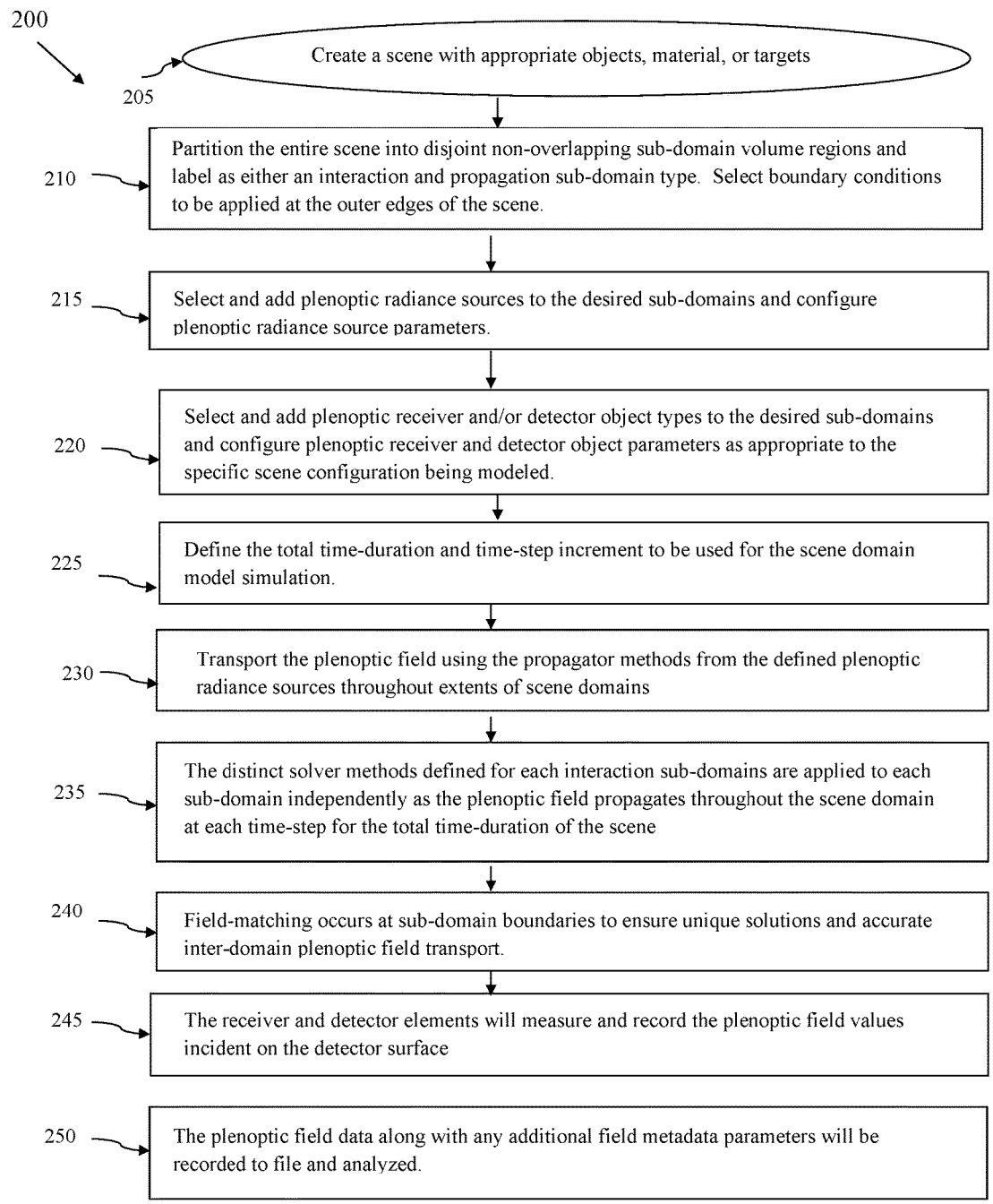
FIG. 2 shows a flow chart of the method in accordance with the Computer Modeling System and Method for Plenoptic Scene Simulation.

FIG. 2 shows a flow chart of a method 200 for computer modeling for plenoptic scene simulation. Step 205 of method 200 is create a scene domain model with appropriate objects, materials, and targets and geographical terrain and environment for a spatial region/volume based on the specific scene configuration to be modeled. Step 210 is to partition the entire scene domain model into disjoint non-overlapping sub-domain volume regions and label each sub-domain as either an interaction and propagation sub-domain type. Select desired boundary conditions to be applied at the outer edges of the scene domain model. Step 215 is to select and add plenoptic radiance sources to the desired sub-domains and configure plenoptic radiance source parameters. Step 220 is to select and add plenoptic receiver and/or detector object types to the desired sub-domains where the plenoptic field information will be measured, received, and/or extracted from the scene model. Configure plenoptic receiver and detector object parameters as appropriate to the specific scene configuration being modelled. If desired for the scene model, at this time volumetric atmospheric participating media can be added to the model domain and the appropriate participating media parameters can be configured for the scenario being modeled.

Step 225 is to define the total time-duration and time-step increment to be used for the scene domain model simulation. For step 230, the propagator methods transport the plenoptic field from the defined plenoptic radiance sources throughout extents of scene domains. For step 240 the distinct solver methods defined for each interaction sub-domains are applied to each sub-domain independently as the plenoptic field propagates throughout the scene domain at each time-step for the total time-duration of the scene.

During step 245, field-matching occurs at sub-domain boundaries to ensure unique solutions and accurate inter-domain plenoptic field transport. Finally for step 250, at configured intervals the receiver and detector elements will measure and record the plenoptic field values incident on the detector surface, such as a focal-plane array, a photodetector, or an avalanche photo-diode.

After step 250 occurs, the measured plenoptic field data along with any additional field metadata parameters will be recorded to file, with separate datasets stored for each time-step interval throughout the entire total duration of the scene model execution. After the scene simulation execution computations are complete, an analyst can apply post-processing analysis methods to the recorded plenoptic field data and metadata, such as quantitative error analysis, novel image processing algorithms, or to produce scene fly-through animations, or other purposes. The analyst may also interrupt the scene execution at any point, either manually or by defining breakpoint conditions to be automatically evaluated, during the simulation process to inspect and evaluate a partial intermediary plenoptic rendering. Both the raw plenoptic field data and the metadata parameters may be inspected. This may be useful for debugging or other research purposes.

All elements and parameters defining the scene will be saved along with all output plenoptic field data and metadata, and can be modified, copied, evaluated, and rerun again as desired by an analyst. Alternative embodiments of the system described herein include hybridized extensible plenoptic field propagation and interaction architecture. Multiple computational solver methods are available for propagator and interaction subdomains. New methods can be implemented using add-on module interfaces. Variable and configurable levels of rigor/fidelity can be used within each sub-domain. Other embodiments can allow analysts to select desired levels of tradeoff between model accuracy and computational effort—locally for each sub-domain and globally for the entire domain. Alternate embodiments can include automatic intelligent prediction and selection of optimal subdomain solver methods to maximize numerical accuracy and minimize computational effort. Statistical confidence intervals and quantitative error bound estimates can be provided for scenario configurations to allow an analyst full control over tradeoffs between numerical rigor/precision and simulation performance/response times.

Alternative embodiments can have Plenoptic Rendering METADATA, wherein auxiliary fields ("metadata") may be generated during modeling and simulation which record individual path trajectory histories, including: each path segment, intersections, angles-of-incidence, and an extensible and user-definable metadata field elements interface.

Alternative embodiments can also include additional features such as support for online reachback nowcast/forecast with numerical weather prediction (NWP) systems, extensive global/regional METOC data points can be ingested to allow accurate regional modeling of environmental/weather/geographical conditions, Interfaces for ingestion/assimilation of external data sets and data formats using a flexible and extensible external data source interface, GPU-accelerated fast radiative transfer solvers: full spectral angular radiance, Libraries of measured global/regional climatology data: aerosol distributions (fog, smoke, dust), atmospheric turbulence and refractivity 3D spatial+time profiles, Post-processing and analysis support of scene metadata: Trajectory filtering and virtual scene reconstruction Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

I claim:

1. A method for generating synthetic computer imagery with complete plenoptic electromagnetic field information through scene domain model simulation comprising the steps of:

creating a scene domain with objects, wherein the scene domain is in the form of an initial plenoptic field;

partitioning the scene domain into a plurality of disjoint non-overlapping sub-domain volume regions, labeling the plurality of disjoint non-overlapping sub-domain volume regions as one of either an interaction or a propagation sub-domain type;

selecting boundary field-matching conditions;

selecting and adding a plurality of plenoptic field sources to the scene domain, the plurality of plenoptic field sources configured to interact dynamically with the initial plenoptic field;

selecting and adding a plurality of plenoptic field receiver and detector object types to the scene domain;

defining a total time-duration and time-step increment to be used;

transporting the initial plenoptic field using propagator methods from the plurality of plenoptic field sources throughout the scene domain;

applying distinct plenoptic field solver methods to the plurality of disjoint non-overlapping sub-domain volume regions;

applying field-matching at sub-domain boundaries;

using receiver and detector elements to measure, record, and analyze plenoptic and metadata field values incident on a detector surface, wherein a dataset is stored for each time-step interval of the scene domain;

applying post-process analysis methods to the dataset, producing synthetic computer imagery.

2. The method of claim 1, further comprising a step of using the initial plenoptic field to obtain $\{x, y, z, t\}$—components of time-varying vector electric and magnetic fields.

3. The method of claim 1, further comprising a step of using the initial plenoptic field to obtain a Poynting vector.

* * * * *